(12) United States Patent
Li et al.

(10) Patent No.: US 6,901,088 B2
(45) Date of Patent: *May 31, 2005

(54) EXTERNAL CAVITY LASER APPARATUS WITH ORTHOGONAL TUNING OF LASER WAVELENGTH AND CAVITY OPTICAL PATHLENGTH

(75) Inventors: Hua Li, San Jose, CA (US); William B. Chapman, Sunnyvale, CA (US); Andrew Daiber, Palo Alto, CA (US); Alejandro D. Farinas, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/900,373

(22) Filed: Jul. 6, 2001

(65) Prior Publication Data

US 2003/0007522 A1 Jan. 9, 2003

(51) Int. Cl.$^7$ ............................. H01S 3/10; H01S 3/098
(52) U.S. Cl. ........................................... 372/20; 372/18
(58) Field of Search ............................. 365/106; 372/20, 372/18; 356/450; 359/122

(56) References Cited

U.S. PATENT DOCUMENTS

| | | | |
|---|---|---|---|
| 3,676,799 A | * | 7/1972 | Danielmeyer ................. 372/32 |
| 3,967,211 A | | 6/1976 | Itzkan et al. |
| 4,309,671 A | | 1/1982 | Malyon |

(Continued)

FOREIGN PATENT DOCUMENTS

| | | |
|---|---|---|
| EP | 0687045 A2 | 6/1995 |
| EP | 0924628 | 8/1998 |
| EP | 0951112 A2 | 3/1999 |
| WO | WO 98/44424 | 10/1998 |
| WO | PCT/US99/24137 | 10/1999 |
| WO | WO 00/49689 | 2/2000 |
| WO | PCT/US02/21413 | 7/2002 |

OTHER PUBLICATIONS

Favre et al.: 'External–Cavity Semiconductor Laser With 15 nm Continuous Tuning Range', Electronics Letters Jun. 19, 1986.

Macleod, H. A. in *Thin Film Optical Filters* $2^{nd}$ Edition, McGraw–Hill, 1989, pp. 244–269.

Mellis et al.: 'Miniature Packaged External–Cavity Semiconductor Laser With 50Ghz Continuous Electical Tuning Range' Electronics Letters, Apr. 22, 1988.

(Continued)

*Primary Examiner*—Don Wong
*Assistant Examiner*—Hung Tran Vy
(74) *Attorney, Agent, or Firm*—Blakely, Sokoloff, Taylor & Zafman LLP

(57) ABSTRACT

An external cavity laser apparatus and method wherein wavelength or channel selection is carried independently from adjustment of external cavity optical path length. The apparatus comprises a wavelength or channel selector tuner and an external cavity tuner, wherein the wavelength tuner is uncoupled from the external cavity tuner. The tuning mechanisms for wavelength selection and cavity optical path length are configured to operate independently or orthogonally with respect to each other. The wavelength tuner may operate according to a first, channel selection signal, while the external cavity tuner operates according to a second, external cavity adjustment signal. The wavelength tuner and external cavity tuner may operate under the control of the same, or of separate controllers. The channel selection signal may be derived from a look-up table of adjustment parameter data accessed by a controller, and the external cavity adjustment signal may be derived from an error signal from a detector configured to measure external cavity loss.

9 Claims, 6 Drawing Sheets

U.S. PATENT DOCUMENTS

| | | | |
|---|---|---|---|
| 4,460,977 A | * | 7/1984 | Shimada et al. ............ 365/106 |
| 4,504,950 A | | 3/1985 | AuYeung |
| 4,560,246 A | | 12/1985 | Cotter |
| 4,583,227 A | | 4/1986 | Kirkby |
| 4,770,047 A | | 9/1988 | Arditty et al. |
| 4,839,614 A | | 6/1989 | Hill et al. |
| 4,843,233 A | | 6/1989 | Jeunhomme |
| 4,870,269 A | | 9/1989 | Jeunhomme et al. |
| 4,932,782 A | | 6/1990 | Graindorge et al. |
| 4,994,677 A | | 2/1991 | Graindorge |
| 5,028,395 A | | 7/1991 | Sebille et al. |
| 5,058,124 A | | 10/1991 | Cameron et al. |
| 5,103,457 A | | 4/1992 | Wallace et al. |
| 5,115,677 A | | 5/1992 | Martin et al. |
| 5,141,316 A | | 8/1992 | Lefevre et al. |
| 5,172,185 A | | 12/1992 | Leuchs et al. |
| 5,181,078 A | | 1/1993 | Lefevre et al. |
| 5,185,643 A | | 2/1993 | Vry et al. |
| 5,225,930 A | | 7/1993 | Land et al. |
| 5,270,791 A | | 12/1993 | Lefevre et al. |
| 5,305,330 A | | 4/1994 | Rieder et al. |
| 5,319,668 A | | 6/1994 | Luecke |
| 5,321,717 A | | 6/1994 | Adachi et al. |
| 5,331,651 A | | 7/1994 | Becker et al. |
| 5,347,527 A | | 9/1994 | Favre et al. |
| 5,349,439 A | | 9/1994 | Graindorge et al. |
| 5,349,440 A | | 9/1994 | DeGroot |
| 5,373,515 A | | 12/1994 | Wakabayashi et al. |
| 5,387,974 A | | 2/1995 | Nakatani |
| 5,412,474 A | | 5/1995 | Reasenberg et al. |
| 5,420,687 A | | 5/1995 | Kachanov |
| 5,428,700 A | | 6/1995 | Hall |
| 5,438,579 A | | 8/1995 | Eda et al. |
| 5,444,724 A | * | 8/1995 | Goto ........................ 372/20 |
| 5,450,202 A | | 9/1995 | Tisue |
| 5,473,625 A | | 12/1995 | Hansen et al. |
| 5,543,916 A | | 8/1996 | Kachanov |
| 5,583,638 A | | 12/1996 | Cutler |
| 5,594,744 A | | 1/1997 | Lefevre et al. |
| 5,596,456 A | | 1/1997 | Luecke |
| 5,606,439 A | | 2/1997 | Wu |
| 5,631,736 A | | 5/1997 | Thiel et al. |
| 5,712,704 A | | 1/1998 | Martin et al. |
| 5,719,674 A | | 2/1998 | Martin et al. |
| 5,737,109 A | | 4/1998 | Goodwin |
| 5,760,391 A | | 6/1998 | Narendran |
| 5,802,085 A | | 9/1998 | Lefevre et al. |
| 5,825,792 A | | 10/1998 | Villeneuve et al. |
| 5,838,713 A | | 11/1998 | Shimoji |
| 5,867,512 A | | 2/1999 | Sacher |
| 5,886,785 A | | 3/1999 | Lefevre et al. |
| 5,946,331 A | | 8/1999 | Amersfoort et al. |
| 5,991,061 A | | 11/1999 | Adams et al. |
| 6,061,369 A | | 5/2000 | Conradi |
| 6,081,539 A | * | 6/2000 | Mattori et al. ................. 372/20 |
| 6,084,695 A | | 7/2000 | Martin et al. |
| 6,108,355 A | * | 8/2000 | Zorabedian ................... 372/20 |
| 6,115,121 A | * | 9/2000 | Erskine ...................... 356/450 |
| RE37,044 E | | 2/2001 | Wu |
| 6,192,058 B1 | | 2/2001 | Abeles |
| 6,205,159 B1 | | 3/2001 | Sesko et al. |
| 6,246,480 B1 | | 6/2001 | O'Brien |
| 6,249,364 B1 | | 6/2001 | Martin et al. |
| 6,252,718 B1 | | 6/2001 | Lefevre |
| 6,282,215 B1 | * | 8/2001 | Zorabedian et al. .......... 372/20 |
| 6,304,586 B1 | | 10/2001 | Pease et al. |
| 6,330,253 B1 | | 12/2001 | Tuganov et al. |
| 6,331,892 B1 | | 12/2001 | Green |
| 6,366,592 B1 | * | 4/2002 | Flanders ..................... 372/18 |
| 6,600,760 B1 | * | 7/2003 | Green et al. .................. 372/20 |
| 6,665,321 B1 | * | 12/2003 | Sochava et al. .............. 372/20 |
| 2002/0126345 A1 | * | 9/2002 | Green et al. ................ 359/122 |
| 2003/0012239 A1 | * | 1/2003 | Daiber et al. ............ 372/38.01 |

OTHER PUBLICATIONS

Takashashi, H., Temperature Stability of Thin–Film Narrow–Bandpass Filters Produced by Ion– Assisted Deposition, Applied Optics, vol. 34 No. 4 Feb 1, 1995.

N.A. Olson et al., "Performance Characteristics of 1.5 μm External Cavity Semiconductor Lasers for Coherent Optical Communication" Journal of Lightwave Technology LT–5 (1987) 510–515, Apr. No. 4, New York, New York, USA.

Zhang et al., "An Interference Filter Based External Cavity Laser For Dense Wavelength Division Multiplexing Applications", Technical Proceedings, vol. 1, National Fiber Optics Engineers Conference, Sep. 13–17, 1998.

Zorabedian et al., "Interference–filter–tuned, alignment–stabilized, semiconductor external–cavity laser", Reprinted from Optics Letters, vol. 13, p. 826, Oct., 1988.

* cited by examiner

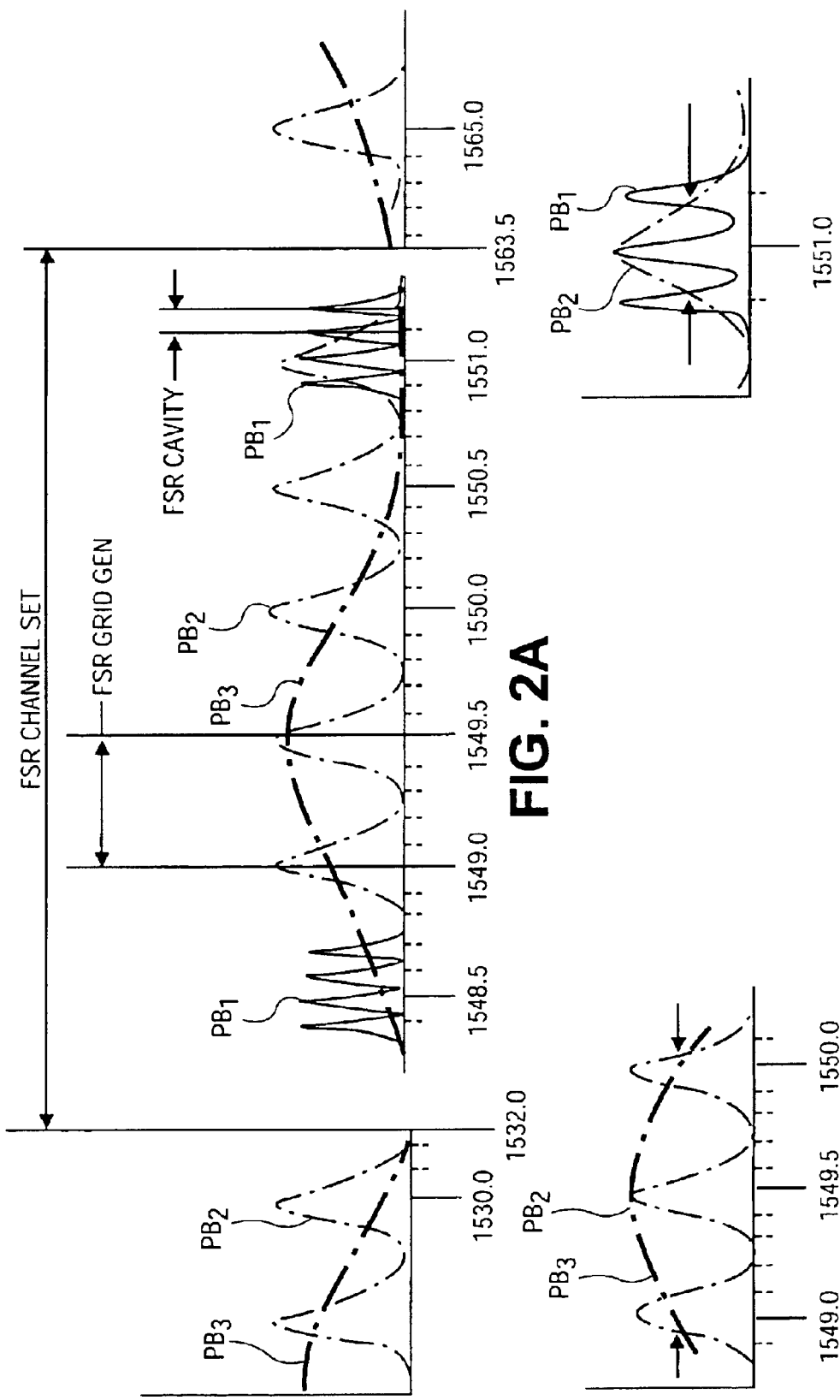

RELATIVE CHANNEL SELECTOR POSITION

EXTERNAL CAVITY LASER APPARATUS WITH ORTHOGONAL TUNING OF LASER WAVELENGTH AND CAVITY OPTICAL PATHLENGTH

CROSS REFERENCE

BACKGROUND OF THE INVENTION

Fiber optic telecommunications are continually subject to demand for increased bandwidth. One way that bandwidth expansion has been accomplished is through dense wavelength division multiplexing (DWDM) wherein multiple separate data streams exist concurrently in a single optical fiber, with modulation of each data stream occurring on a different channel. Each data stream is modulated onto the output beam of a corresponding semiconductor transmitter laser operating at a specific channel wavelength, and the modulated outputs from the semiconductor lasers are combined onto a single fiber for transmission in their respective channels. The International Telecommunications Union (ITU) presently requires channel separations of approximately 0.4 nanometers, or about 50 GHz. This channel separation allows up to 128 channels to be carried by a single fiber within the bandwidth range of currently available fibers and fiber amplifiers. Improvements in fiber technology together with the ever-increasing demand for greater bandwidth will likely result in smaller channel separation in the future.

The drive towards greater bandwidth has led to use of precision wavelength-specific DWDM devices that require careful adjustment and calibration according to the narrow transmission channel spacings. Continuously tunable lasers have been developed to aid in the test and measurement of these sophisticated devices. Tunable lasers of this sort typically utilize a tuning element, such as a pivotally adjustable grating within an external cavity, in order to generate an adjustable wavelength sweep in the laser output that can be used in the characterization of precision WDM components.

One problem which can arise with such tunable lasers is "mode-hopping" wherein the laser changes frequency discontinuously to a different longitudinal mode. When used as a telecommunication transmitter, these mode hops will cause transmission errors in the modulated data stream. One approach taken for designing tunable lasers is to use a relatively long cavity with finely spaced modes, and tune the laser in a "quasi-continuous" manner, mode hopping between the finely spaced modes. Inherent to this design is the fact that a mode hop occurs when the wavelength of operation is changed. The modes themselves are not controlled, and thus the wavelength of operation cannot be precisely tuned within the interval of a mode hop.

Another approach to tunable lasers is "mode hop free" tuning where the cavity length is synchronously changed with the wavelength tuning mechanism to keep the laser operating in the same longitudinal mode while tuning. This approach can potentially avoid the mode hopping problem and can tune to all wavelength but the constraint of synchronous adjustment makes the implementation of this design difficult.

The increasing use of re-configurable optical network architectures has recently led to the use of tunable external cavity lasers as optical communication transmitters. The tunable external cavity lasers used for telecommunication have been configured in generally the same manners as the tunable lasers used for test and measurement purposes, with the tuning of the grating being coupled to tuning of the external cavity to provide mode hop-free tuning in the laser wavelength output.

This type of mode hop-free tuning, however, has proved to be non-optimal for stable tuning to narrowly spaced transmission bands, as is required for high bandwidth DWDM systems. Mode hop-free tuning is often difficult to implement and in many cases involves a time-consuming location of a specific or "magic" pivot point to provide a specific rotation/translation relationship for tuning the grating and optical cavity length.

More particularly, the design goal of mode hop free tuning is to couple the wavelength selection filter, which selects one of the many possible longitudinal modes of the laser, with changes in the effective cavity length of the cavity, which determines the wavelength of the longitudinal modes, and thus the exact wavelength of operation. When the coupling between the cavity length and wavelength filtering is not precise, mode hops may still occur along the tuning curve, albeit at fewer points than if there was no coupling. More particularly, the coupling of the wavelength filter to the cavity modes precludes adjusting the wavelength filter without coupling this change directly into the cavity length and wavelength of operation. Although a mode hop free tuning architecture may be a good design choice for a test and measurement laser, it is not necessarily an optimal design choice for a tunable DWDM transmitter source.

When tuned, a DWDM transmitter must cease emission at the original wavelength of operation and then recommence emission at a second, precisely defined, wavelength. In general, emission at any other wavelength cannot be sent into the system since this may cause crosstalk between the channel being tuned and other transmission channels. One method for tuning is to mode hop the laser directly to the target wavelength. It is more practical to tune with the laser powered down, shuttered, filtered, or otherwise guaranteed to avoid other wavelengths during tuning, where these precautions may be taken at the system level or at the source. With these precautions, the precise mode hop behavior of the laser during tuning between channels is not important. It is important that the target wavelength is precisely achieved. The effective cavity length, which determines the exact wavelength of operation, must be precisely controlled. Only after tuning and transmission into the system commences must mode hopping, which causes amplitude and frequency changes in the source, be avoided.

In some DWDM systems, the channel frequencies are adjusted during operation to maximize system capacity at acceptable bit error rate. Telecommunication sources must operate over a large temperature range, with −5° C. to 70° C. being typical, and the effect this temperature has on effective cavity length, filter characteristics, and the general state of the laser, must be countered. The operation characteristics of thermal compensation and fine frequency control are similar and lead to the requirement that a telecommunication transmitter have precise control of cavity length and the wavelength filtering element. In view of these design considerations, a mode hop free tuning approach does not confer the same advantages in DWDM source applications as it does in a test and measurement application. There is a need for a tunable laser source for DWDM applications which has independent fine control of the wavelength filtering element and cavity length but is not restricted to avoiding mode hop behavior when coarsely tuning.

SUMMARY OF THE INVENTION

The invention provides an external cavity laser system and method wherein wavelength or channel selection is carried out independently from adjustment of external cavity optical path length. In general terms, the invention is an external cavity laser apparatus comprising a wavelength or channel selector tuner and an external cavity tuner, wherein the wavelength tuner is uncoupled or decoupled from the external cavity tuner, or wherein such coupling is minimized. In other words, the tuning mechanisms for wavelength selection and cavity optical path length are configured to operate independently or orthogonally with respect to each other such that tuning the wavelength passband of the tuning filter has minimal effect on the effective cavity length, and adjusting the effective cavity length has minimal effect on the passband of the tuning filter.

In some embodiments, the tuning filter and cavity path length are tuned independently and orthogonally such that a first tuner affects the passband of the tuning filter with minimum affect on the cavity path length, while a second tuner affects the cavity path length while having minimum affect on the passband of the tuning filter. In other embodiments, the tuning mechanisms may affect both the passband and cavity path length, but the tuning mechanisms are coordinated so that the net effect is primarily an adjustment of the passband or primarily an adjustment of the cavity path length.

More specifically, the first tuner may affect both the passband of the tuning filter and the cavity path length, while the second tuner may affect one or both the passband and cavity path length but in a different or non-identical manner. There then exists a coordinated tuning of both tuners that adjusts the passband of the tuning filter with minimal effect on the cavity length, and a second coordinated tuning that adjusts the cavity length with minimal effect on the passband. These two coordinated tunings are "orthogonal".

The passband position may operate according to a first, channel selection signal, while the cavity length tuner operates according to a second, cavity mode adjustment signal. The channel selection signal may be derived from a look-up table of adjustment parameter data accessed by a controller, or an error signal derived from a detector. The cavity mode adjustment signal may be derived from adjustment parameters stored in a look-up table, or as an error signal from a detector. The detector may comprise a voltage detector positioned and configured to measure voltage across a gain region associated with the external cavity. In other embodiments, the detector may comprise an optical detector positioned to receive output from the external cavity.

In certain embodiments, the external cavity laser of the invention includes a gain medium having first and second output facets and emits a coherent beam from the first output facet along an optical path. An end mirror is located in the optical path, and the end mirror and second output facet define an external cavity for the laser. Output from the second output facet may be coupled into an optical fiber. A channel selector is positioned in the optical path between the second output facet and end mirror. The channel selector affects the passband of the intracavity filtering, and the channel selector is operatively coupled to the tuning mechanisms.

The channel selector may comprise an etalon with parallel reflective surfaces separated by a spacer layer. A tuning mechanism operates on the etalon by changing the optical path length of the spacer layer. For air or liquid spaced etalons, tuning mechanisms may comprise piezoelectric, thermal, pressure, and micromechanical mechanisms. For etalons filled with an electrooptic material such as Lithium Niobate or liquid crystals, the tuning mechanism may comprise an applied electric field. For solid etalons, the tuning mechanism may be thermal or mechanical. The channel selector may comprise a wedge etalon is tunable by macroscopic positional adjustment of the wedge etalon that changes the position at which the intracavity beam passes through the filter to a new position where the spacer layer is microscopically thicker or thinner and consequently the wavelength of peak transmission is longer or shorter respectively.

In other embodiments, the channel selector may comprise a surface grating that determines which wavelengths coming from the gain region are efficiently diffracted back into the gain region. The shape of the filter generally consists of a wavelength with maximum coupling efficiency surrounded by a passband of wavelengths with high coupling efficiency. The passband may be tuned in wavelength by adjusting the angle with which the beam strikes the grating. If the center of rotation is at the location where the beam center intersects the grating, then the passband will be adjusted with minimal change in the effective path length of the laser cavity. Translating the grating changes the effective path length of the laser cavity by an amount proportional to the component of translation along the beam path. The translation will have minimal effect on the passband provided that minimal rotation occurs with the translation.

The grating may be actuated by two mechanical actuators, such as micromechanical actuators or piezoelectric actuators, attached to two points on the grating. With this arrangement of actuators, each individual actuator will affect both the translation and rotational state of the grating. The effect of the actuators may be orthogonalized by coordination of their actuation. There exists a first proportional actuation of both actuators that effects a pure rotation of the grating, and a second proportional actuation of both actuators that effects a pure translation of the grating. The first, pure rotation actuation changes the passband of the filtering with minimal effect on the optical path length of the cavity, while the second, pure rotation actuation changes the cavity length with minimal effect on the passband. In this manner, the grating is given orthogonal or independent adjustment of the passband and effective cavity length by two actuators coupled to the grating. The type and placement of the actuators may vary depending upon the particular use of the invention.

In certain embodiments, one rotational actuator and one translation actuator may be used in place of the two translation actuators. The rotation actuator may operate on a mirror or a retroreflection assembly that operates on the intracavity beam, and not the grating, to achieve an angular change between the beam and grating. Likewise, liquid crystal or other electrooptic beam steering devices may be used instead of a rotating mirror. The rotation may further be accomplished by placing a lens in the beam, and placing a spatial light modulator at the focal plane of the lens, where each angle is mapped to a unique spatial location. Liquid crystal spatial light modulators, micromechanical "digital micromirror devices", and micromechanical grating light valves may be used in the laser cavity.

The external cavity tuner, in certain embodiments, may comprise a cavity length actuator comprising a thermoelectric device configured to drive heat into a thermally activated expansion member to which the end mirror is attached. The external cavity tuner may alternatively comprise a mechanical or micromechanical assembly configured to actuate the position of the end mirror, or an electro-optic element associated with the external cavity and operable to change the effective optical path length of the external cavity by application of voltage to the electro optic element.

During operation of an external cavity laser in accordance with the invention, tuning the channel selector provides wavelength intensity filtering that is independent from or substantially uncoupled from tuning of the external cavity optical path length. The optical path length determines the exact wavelength of operation and must be carefully controlled in laser operations requiring a high degree of wavelength accuracy and stability. The channel selector acts as a tunable intensity filter and coarsely determines wavelength by selecting which laser mode is lasing with high intensity. The uncoupling or orthogonalizing of the wavelength intensity filtering from the optical path length prevents wavelength changes which might otherwise occur due to vibration, thermal fluctuation, component wear and other factors affecting the channel selector.

BRIEF DESCRIPTIONS OF THE DRAWINGS

FIGS. 2A–2C are graphical illustrations of passband characteristics of the external cavity laser of FIG. 1 for the wedge etalon, grid etalon and external cavity with respect to a selected channel in a wavelength grid.

DETAILED DESCRIPTION OF THE INVENTION

Figure 1:
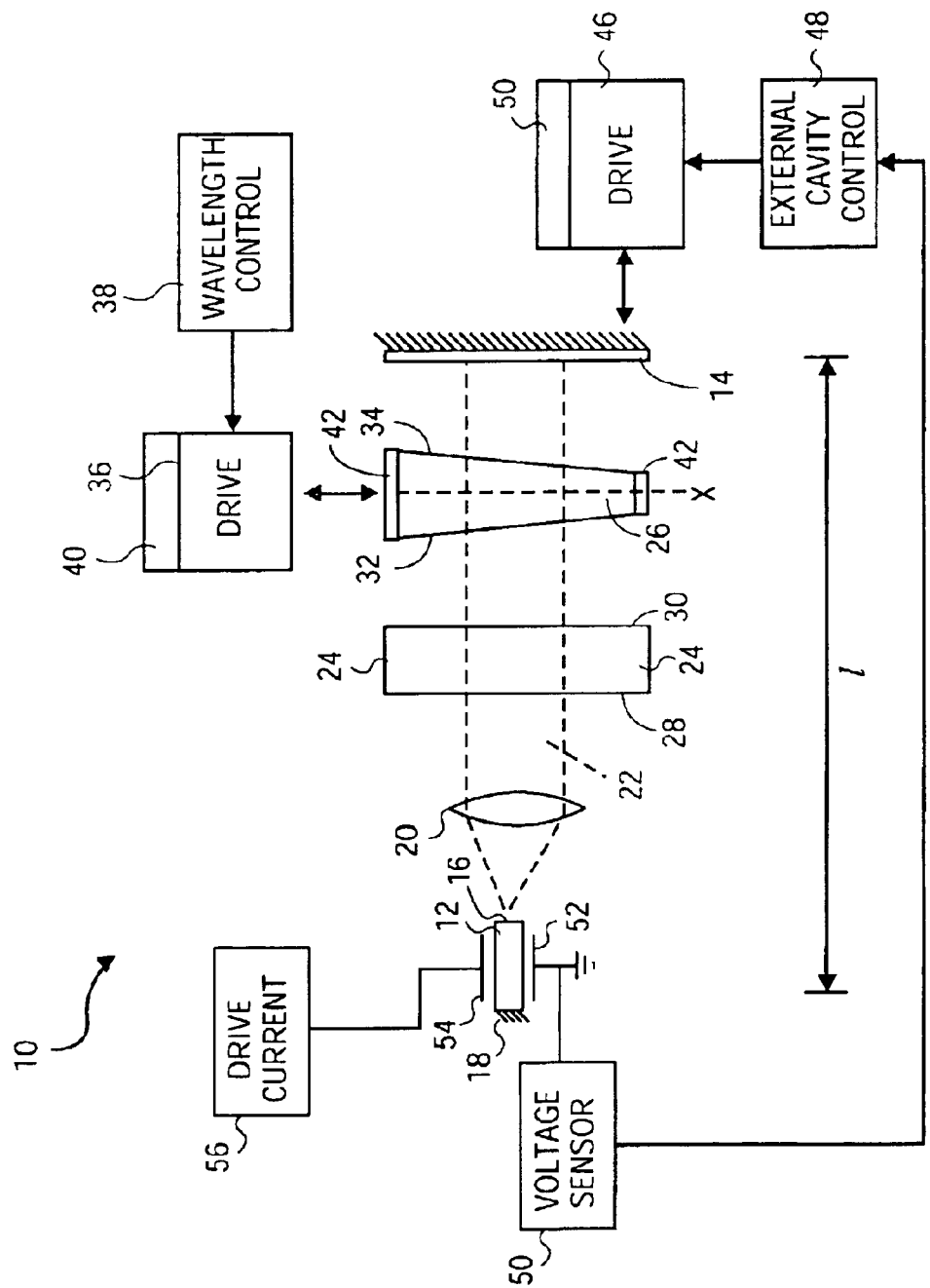
FIG. 1 is a schematic diagram of an external cavity laser apparatus with a wedge etalon channel selector using independent wavelength tuning and external cavity tuning.

Referring more specifically to the drawings, for illustrative purposes the present invention is embodied in the apparatus and method shown in FIG. 1 through FIG. 6. It will be appreciated that the apparatus may vary as to configuration and as to details of the parts, and that the method may vary as to details and the order of events, without departing from the basic concepts as disclosed herein. The invention is disclosed primarily in terms of use with an external cavity laser. However, it will be readily apparent to those skilled in the art that the invention may be used with other types of lasers and optical systems. It also should be understood that the terminology used herein is for the purpose of describing particular embodiments only, and is not intended to be limiting.

A fundamental underlying physical principle of steady state laser operation is that the electric field of the optical wave inside the cavity reproduce itself after traversing a round trip in the cavity. This condition also applies if the laser is modulated more slowly than the time it takes for light to complete a round trip of the cavity. The electric field is a complex quantity that may be specified with two real quantities such as amplitude and phase. Expressed using the real quantities of amplitude and phase, the round trip consistency condition becomes two conditions. The amplitude of the optical wave reproduces itself after traversing a round trip in the cavity and the phase of the optical wave likewise reproduces itself.

This invention provides a laser apparatus that can affect the round trip amplitude filtering of the optical wave while minimally effecting the round trip phase and separately affect the round trip phase while minimally affecting the round trip amplitude filtering. The round trip phase can replicate itself only if the phase modulo $2\pi$ is zero. Wavelengths with net zero round trip phase are called laser modes and are the only wavelengths at which a laser will operate.

The round trip phase is primarily determined by the round trip optical path length divided by the wavelength of the optical beam, but is also slightly influenced by small phase shifts invariably associated with amplitude filtering as well as scattered light from optical surfaces other than the end mirror. The optical path length of the cavity means generally the total round trip phase at the wavelength of lasing. The effect on the optical path length resulting from changing the intracavity amplitude filtering is minimal if the change in optical path length divided by the original pathlength is less than half the change in wavelength of the passband divided by the original wavelength. The effect of scatter from other optical surfaces will be minimal when the amplitude of the scatter is small relative to the total amplitude of the round trip optical wave.

The round trip amplitude strongly affects the relative intensity of the possible laser modes. The laser will generally operate on the mode with the highest round trip transmission, and if other modes have a round trip transmission less than half that of the lasing mode then the intensity of these other modes during normal operation will generally be less than a thousandth that of the lasing mode. This round trip amplitude filtering includes the spectral properties of all optical surfaces as well as gain in the gain region. Thus, for example, the transmission of wavelengths will be negligible outside the gain spectrum of the gain region even if an optical filter placed in the cavity has a transmission maximum at one of those wavelengths. This consideration is particularly relevant for etalon filters, which have multiple transmission peaks and gratings that have multiple diffraction orders. A static filter with a high transmission passband covering the tuning range of interest and low transmission outside the tuning range may be used to achieve a round trip amplitude filtering with no transmission maxima outside the tuning range of the laser. A grid generator filter with periodic transmission maxima will limit possible lasing to locations of substantial transmission near the maxima.

The round trip amplitude filtering also consists of a tunable filter with a single transmission peak within the tuning range of interest and a passband of high transmission surrounding the peak. Examples of such filters are etalons whose free spectral range exceeds the tuning range of interest, surface gratings, and Bragg or reflection gratings. The tunable filter may also consist of multiple elements which achieve a similar effect, for example an element with multiple transmission peaks and a tunable element with multiple peaks spaced differently from the first; the net effect of which is a single transmission peak that occurs where the peaks from both elements are made to overlap, and vernier style tuning of which peaks overlap.

Amplitude filtering may be considered as the total intracavity round trip amplitude transmission, and intensity filtering is the square of the amplitude filtering, i.e., the total intracavity round trip intensity transmission. Tunable amplitude filtering is provided to the total intracavity round trip amplitude transmission in the situation where this transmission may be effected by one or more tunable elements. The effect of a cavity path length change on the tunable amplitude filtering is minimal if the change in the center wavelength of the passband of the amplitude filter divided by the original wavelength is less than half the change in the optical path length divided by the original path length. It is noted that for "mode hop free tuning" the change in optical path length divided by the original path length is equal to the change in center wavelength of the passband of the amplitude filter divided by the original wavelength.

With the above in mind, reference is now made to FIG. 1, wherein is shown an external cavity laser apparatus 10 with orthogonal wavelength tuning and cavity optical path length tuning. The apparatus 10 includes a gain medium 12 and an end or external reflective element or end mirror 14. Gain medium 12 may comprise a conventional Fabry-Perot diode emitter chip and has an anti-reflection (AR) coated front facet 16 and a partially reflective rear facet 18. The external laser cavity is delineated or defined by rear facet 18 and end mirror 14. Gain medium 12 emits a coherent beam from front facet 16 that is collimated by lens 20 to define an optical path 22 which is co-linear with the optical axis of the external cavity, with end mirror 14 positioned in optical path 22. Front and rear facets 16, 18 of gain medium 12 are aligned with the optical axis of the external cavity as well. Conventional output coupler optics (not shown) are associated with rear facet 18 for coupling the output of external cavity laser 10 into an optical fiber.

The external cavity laser 10 includes a grid generator element and a tunable element or channel selector, which are respectively shown in FIG. 1 as a grid etalon 24 and a wedge etalon 26 positioned in optical path 22 between gain medium 12 and end mirror 14. Grid etalon is positioned in optical path 22 before tunable element 26, and has parallel reflective faces 28, 30. Grid etalon 24 operates as an interference filter, and the refractive index of grid etalon 24 and the optical thickness of grid etalon 24 as defined by the spacing of faces 28, 30 give rise to a multiplicity of transmission maxima within the communication band at wavelengths which coincide with the center wavelengths of a selected wavelength grid which may comprise, for example, the ITU (International Telecommunications Union) grid. Other wavelength grids may alternatively be selected. Grid etalon 24 has a free spectral range (FSR) that corresponds to the spacing between the grid lines of the ITU grid, and the grid etalon 24 thus operates to provide a plurality of passbands centered on each of the gridlines of the wavelength grid. Grid etalon 24 has a finesse (free spectral range divided by full width half maximum or FWHM) that suppresses neighboring modes of the external cavity laser between each channel of the wavelength grid, as discussed further below.

Grid etalon may be a parallel plate solid, liquid or gas spaced etalon, and may be tuned by precise dimensioning of the optical thickness between faces 28, 30 by thermal expansion and contraction via temperature control. The grid etalon 24 may alternatively be tuned by tilting to vary the optical thickness between faces 28, 30, by application of an electric field to an electro-optic etalon material, by changing the pressure of a gas spaced etalon, by inducing an index change in a nonlinear optical material with a second optical beam, or by changing the size of a spacer that determines the spacing in a gas or liquid filled etalon by thermal, piezoelectric, or micromechanical means. Grid etalon 24 alternatively may be actively tuned during laser operation as described in the U.S. patent application Ser. No. 09/900,474 entitled "External Cavity Laser with Continuous Tuning of Grid Generator" to inventor Andrew Daiber, co-filed herewith, and incorporated herein by reference.

The wedge etalon channel selector 26 acts as an interference filter with substantially parallel reflective surfaces 32 and 34. The separation between surfaces 32 and 34 may be finely changed along the laser axis, by an amount less then or equal to the wavelength of operation, by extending surfaces 32 and 34 beyond the area where the beam strikes these surfaces and tapering the spacer between these surfaces. The taper is small enough that the thickness change between 32 and 34 across the laser beam is negligible or tolerable, and is large enough that macroscopic motion of the filter across the beam introduces a microscopic change in the distance between 32 and 34 along the beam. The space between surfaces 32 and 34 may be gas filled, liquid filled, or filled with a solid. The space between surfaces 32 and 34 may be changed by thermally expanding a solid etalon, by thermally, piezoelectrically, or micromechanically expanding the spacing means in a gas or liquid etalon, by tilting the gas, solid, or liquid etalon, by changing the pressure of a gas spaced etalon, by using an electrooptic material as the spacer and changing the index with an applied electric field, by using a nonlinear optical material in the spacer layer and inducing a path length change with second optical beam, or by other tuning mechanism.

Wedge etalon 26 as shown in FIG. 1 is only one tunable element or channel selector that may be used in accordance with the invention in an external cavity laser, and various other types of channel selector may be used in place thereof, including grating, electro-optic, thin film and vernier tuning devices. The use of an air gap wedge etalon for channel selection is described in U.S. Pat. No. 6,108,355, wherein the "wedge" is a tapered air gap defined by adjacent substrates. The use of pivotally adjustable grating devices as channel selectors tuned by grating angle adjustment and the use of an electro-optic tunable channel selector in an external cavity laser and tuned by selective application of voltage are described in U.S. patent application Ser. No. 09/814,646 to inventor Andrew Daiber and filed on Mar. 21, 2001. The use of a translationally tuned graded thin film interference filter as a channel selector is described in U.S. patent application Ser. No. 09/814,646 and in U.S. patent application Ser. No. 09/900,412 entitled "Graded Thin Film Wedge Interference Filter and Method of Use for Laser Tuning" to inventors Hopkins et al., co-filed herewith. The aforementioned disclosures are incorporated herein by reference.

The relative size, shape and distances between the various optical components of external cavity laser 10 are in some instances exaggerated for clarity and are not necessarily shown to scale. External cavity laser 10 may include additional components (not shown), such as focusing and collimating components, and polarizing optics configured to remove spurious feedback associated with the various components of external cavity laser 10, and a (nontunable) filter which blocks wavelengths outside the tuning range of interest but within the gain profile of the gain medium Wedge etalon 26 defines a plurality of passbands which are substantially broader than the passbands of the grid etalon 34, with the broader passbands of the wedge etalon 36 having a periodicity substantially corresponding to or greater than the separation between the shortest and longest wavelength channels defined by the grid etalon 34. In other words, the free spectral range of the wedge etalon 36 exceeds the full wavelength range of the wavelength grid defined by grid etalon 34. The wedge etalon 36 has a finesse that suppresses channels adjacent to a particular selected channel.

The wedge etalon 26 is used to select between multiple communication channels by changing the optical thickness between faces 32, 34 of wedge etalon 26. This is achieved by translating or driving wedge etalon 26 along axis x, which is parallel to the direction of taper of wedge etalon 26 and perpendicular to optical path 22 and the optical axis of external cavity laser 10. Each of the passbands defined by the wedge etalon 26 supports a selectable channel, and as the wedge is advanced or translated into optical path 22, the beam traveling along optical path 22 passes through increasingly thicker portions of wedge etalon 26 which support constructive interference between opposing faces 32, 34 at longer wavelength channels. As wedge etalon 26 is withdrawn from optical path 22, the beam will experience increasingly thinner portions of wedge etalon 26 and expose passbands to the optical path 22 that support correspondingly shorter wavelength channels. The free spectral range of wedge etalon 26 corresponds to the complete wavelength range of grid etalon 24 as noted above, so that a single loss minimum within the communications band can be tuned across the wavelength grid. The combined feedback to gain medium 12 from the grid etalon 24 and wedge etalon 26 support lasing at the center wavelength of a selected channel. Across the tuning range, the free spectral range of the wedge etalon 26 is broader than that of grid etalon 24.

Wedge etalon 26 is positionally tuned via a wavelength tuning assembly or mechanism which comprises a wavelength tuner drive element 36 structured and configured to adjustably position wedge etalon 26 according to selected channels. Wavelength tuner drive element 36 may comprise a stepper motor together with suitable hardware for precision translation of wedge etalon 26. Wavelength tuner drive 36 may alternatively comprise various types of actuators or adjustment mechanisms, including, but not limited to, DC servomotors, solenoids, voice coil actuators, piezoelectric actuators, ultrasonic drivers, shape memory devices, and like linear and/or rotation actuators. Where a different type of channel selector other than wedge etalon 26 is used with the invention, wavelength tuner drive 36 will accordingly be configured to tune the channel selector. A linear encoder 40 may be used in association with wedge etalon 26 and wavelength tuner drive 36 to ensure correct positioning of wedge etalon 26 by drive 36. A coarse spectrometer (not shown) that monitors the wavelength of operation may alternatively, or additionally, be used to ensure correct positioning of wedge etalon 26 by drive 36, or the correct positioning of a different type of channel selector by drive 36.

Wavelength tuner drive element 36 is operatively coupled to a wavelength controller 38, which provides signals to control the positioning of wedge etalon 26 by drive element 36. Wavelength controller 38 may include a data processor and memory (not shown) wherein are stored lookup tables of wavelength tuning information for wedge etalon 26, which provide positions correspond to selectable channel wavelengths. Wavelength controller 38 derives or creates appropriate channel or wavelength selection signals that are communicated to wavelength drive 36, which in turn drives or adjusts wedge etalon 26. Wavelength controller 38 may be internal to wavelength tuner drive 36, or may be external and shared in other component positioning and servo functions of the external cavity laser 10.

When external cavity laser 10 is tuned to a different communication channel wavelength, wavelength controller 38 signals wavelength drive element 36 according to positional data in the look up table, and drive element 36 translates or otherwise adjusts wedge etalon 26 to the correct position wherein the optical thickness of the portion of the wedge etalon 26 positioned in optical path 22 provides constructive interference which supports the selected channel. A linear encoder 40 may be used in association with wedge etalon 26 and wavelength tuner drive 36 to ensure correct positioning of wedge etalon 26 by wavelength tuner drive 36.

Wedge etalon 26 may include, as an additional encoder feature, opaque regions 42, 44 at its ends that are optically detectable and which serve to verify the position of wedge etalon 26 when it has been positionally tuned to its longest or shortest channel wavelength. Opaque regions 42, 44 provide an additional encoder mechanism usable in the positional tuning of wedge etalon. When wedge 26 is moved into a position such that one of opaque regions 42, 44 enters optical path 22, the opaque region 42, 44 will block or attenuate the beam along optical path. This attenuation of light is detectable, as described further below. These opaque regions may be used as a "home" and "too-far" signals. The home signal can be used to initialize a coordinate system from which motor positions may be referenced. The position of the drive train away from home may then be determined by counting the number of steps or microsteps a stepper motor has taken and then combining this information with the angle taken in a step and the pitch of the lead screw. Alternatively, an encoder may be attached to the drive train. The home signal may further be used to compensate for thermal expansion of the lead screw or mechanical wear of the drive nut by providing a reference close to the optical element and searching for this reference periodically.

The external cavity defined by end mirror 14 and output facet 18 is tunable by an external cavity tuner or drive mechanism 46. In the embodiment shown, external cavity drive 46 is operatively coupled to end mirror 14 and is configured to adjust the optical path length l of the external cavity by positionally adjusting end mirror 14. In other embodiments, the external cavity drive 46 may be operatively coupled to gain medium 12 and configured to positionally adjust gain medium 12 to tune the external cavity or to thermally adjust the optical path length of the gain medium 12 to tune the external cavity. In still other embodiments, external cavity drive 46 may by electro-optic in nature and carry out adjustment of optical path length l by changing the effective optical thickness of an electro-optic tuner (not shown) in the external cavity, as described further below. Electro-optic tuning of an external cavity is disclosed in U.S. patent application Ser. No. 09/900,426 entitled "Evaluation and Adjustment of Laser Losses According to Voltage Across Gain Medium" to inventors Daiber et al., the disclosure of which is incorporated herein by reference. Various mechanisms for tuning the optical path length l may be used with the invention, and the wavelength tuning will be configured accordingly to provide adjustment of optical path length l.

In certain embodiments, external cavity drive 46 may comprise a thermally tunable compensator element (not shown) that is configured to position end mirror 14 by heating or cooling the thermal compensator element according to optical cavity adjustment signals from external cavity controller 48 to a thermoelectric controller (also not shown) coupled to the thermally tunable compensator element. The use of a thermally controlled tuning element to positionally adjust an end mirror and other optical components in an external cavity laser is also described in U.S. patent application Ser. No. 09/814,646 to inventor Andrew Daiber, filed on Mar. 21, 2001, and in U.S. patent application Ser. No. 09/900,443 entitled "Laser Apparatus with Active Thermal Tuning of External Cavity" to inventors Mark Rice et al., which is co-filed simultaneously herewith.

External cavity drive 46 is operatively coupled to an external cavity controller 48 which provides signals to control the positioning of end mirror 14 by external cavity drive 46. External cavity controller 46 may be operatively coupled to a voltage sensor 50, which in turn is operatively coupled to one of a pair of electrodes 52, 54 associated with gain medium 12. Electrodes 52, 54 provide a drive current to gain medium 12 from drive current source 56. Since optical feedback from end mirror 14 enters gain medium 12 through anti-reflection coated front facet 16, voltage across gain medium 12 as monitored by sensor 50 accurately indicates losses associated with the external cavity. External cavity controller 48 is configured to generate cavity mode signals from the output of voltage sensor 50, and to provide compensating signals to external cavity drive 46. The use of monitoring voltage modulation across a gain medium in an external cavity laser to evaluate external cavity losses and generate error signals therefrom is also described in U.S. patent application Ser. No. 09/900,426 entitled "Evaluation and Adjustment of Laser Losses According to Voltage Across Gain Medium" to inventors Daiber et al., the disclosure of which is incorporated herein by reference.

External cavity controller 48 may alternatively, or additionally, include stored lookup tables of optical cavity tuning information that provides positions correspond to selectable optical path lengths l. External cavity controller 48 may be internal to external cavity drive 46, or may be external and shared in other component positioning and servo functions of the external cavity laser 10. External cavity controller 46 may, in certain instances, be embodied in the same controller device as wavelength controller 36 described above. An encoder 50 may be included in association with external cavity drive 46 to ensure correct positioning or adjustment thereof by external cavity controller 48.

External cavity laser 10, or various components thereof, may be embodied in a microelectromechanical system or MEMS device, wherein an adjustable end mirror is machined from a single silicon substrate which may be integral to other parts of the external cavity laser. The embodiment of an external cavity layer in a MEMS device is described in U.S. patent application Ser. No. 09/814,646 filed on Mar. 21, 2001 and noted above.

The passband relationship of the grid etalon 24, wedge etalon 26 and the external cavity defined by rear facet 18 and end mirror 14 are illustrated graphically in FIG. 2A through FIG. 2C, which show external cavity longitudinal mode passbands PB1, grid etalon passbands PB2, and wedge etalon passbands PB3. Relative gain is shown on the vertical axis and wavelength on the horizontal axis. As can be seen, free spectral range of the wedge etalon 26 ($FSR_{Channel\ Set}$) is greater than the free spectral range of the grid etalon 24 ($FSR_{Grid\ Gen}$), which in turn is greater than the free spectral range of the external cavity ($FSR_{cavity}$). The passband peaks PB1 (laser modes) of the external cavity periodically align with the center wavelengths of passbands PB2 defined by the wavelength grid of grid etalon 24. There is one passband peak PB3 from the wedge etalon 26 that extends over all of the passbands PB2 of the wavelength grid. In the specific example shown in FIGS. 2A–2C, the wavelength grid extends over sixty four channels spaced apart by one half nanometer (nm) or 62 GHz, with the shortest wavelength channel at 1532 nm, and the longest wavelength channel at 1563.5 nm.

The finesse of grid etalon 24 and wedge etalon 26 determine the attenuation of neighboring modes or channels. As noted above, finesse is equal to the free spectral range over the full width half maximum, or finesse=FSR/FWHM. The width for a grid etalon passband 56 at half maximum is shown in FIG. 2B, and the width for a wedge etalon passband 58 at half maximum is shown in FIG. 2C. The positioning of grid etalon 24 and wedge etalon 26 within the external cavity improves side mode suppression.

Figure 3A:
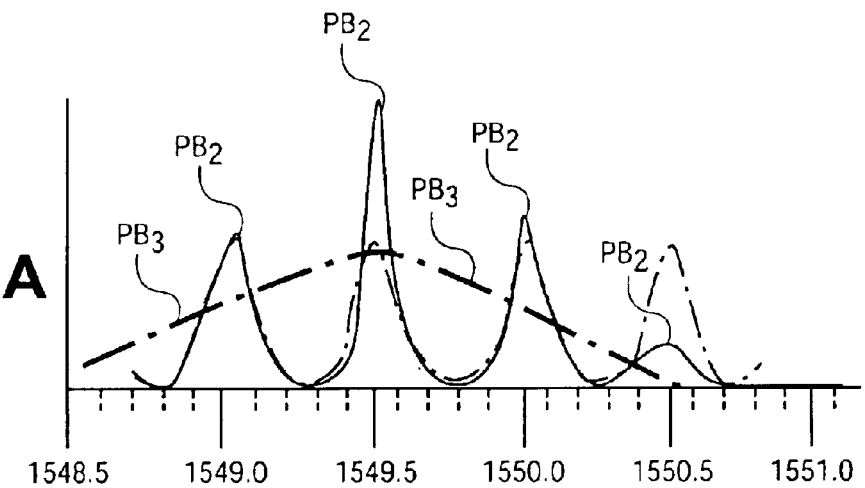
FIGS. 3A–3C are graphical illustrations of gain response to tuning of the external cavity laser of FIG. 1 for a plurality of channels in a wavelength grid.
Figure 3B:
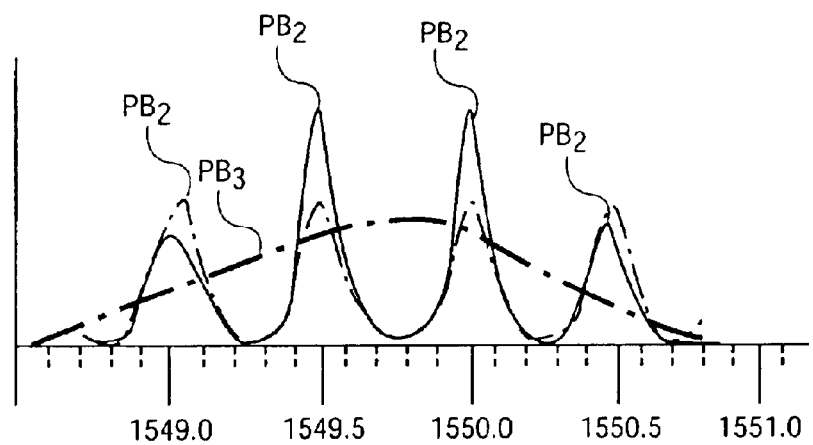
Figure 3C:
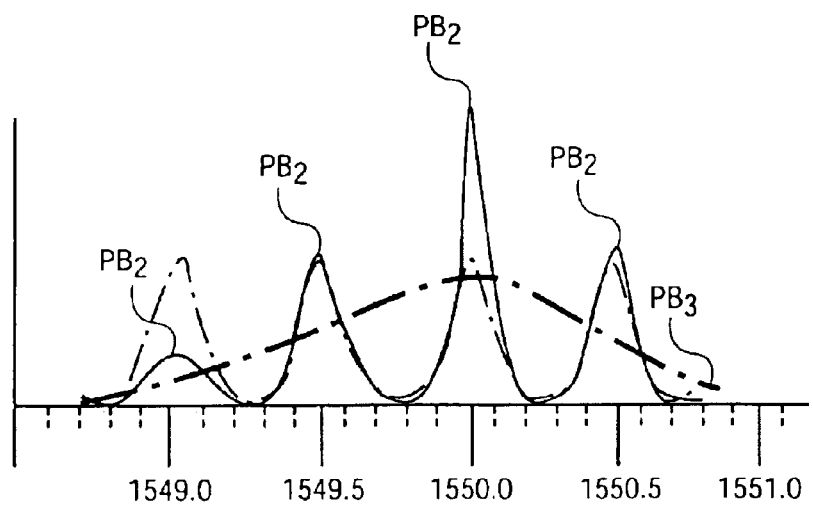

The tuning of the passband PB3 of wedge etalon 26 between a channel centered at 1549.5 nm and an adjacent channel at 1550 nm is illustrated graphically in FIGS. 3A–3C, wherein the selection of a channel generated by grid etalon 24 and the attenuation of adjacent channels or modes is shown. The external cavity passbands PB1 shown in FIGS. 2A–2C are omitted from FIGS. 3A–3C for clarity. The grid etalon 24 selects periodic longitudinal modes of the external cavity corresponding to the grid channel spacing while rejecting neighboring modes. The wedge etalon 26 selects a particular channel in the wavelength grid and rejects all other channels. The selected channel or lasing mode is stationary at one particular channel for filter offsets in the range of approximately plus or minus one half channel spacing. For larger channel offsets the lasing mode jumps to the next adjacent channel.

In FIG. 3A, the wedge etalon passband PB3 is centered with respect to the grid channel at 1549.5 nm. The relative gain associated with passband PB2 at 1549.5 nm is high, while the relative gain levels associated with adjacent passbands PB2 at 1549.0 nm and 1550.0 nm are suppressed relative to the selected 1549.5 nm channel. The gain associated with passbands PB2 at 1550.5 nm and 1548.5 nm is further suppressed. The dashed line indicates the relative gain for passbands PB2 without suppression by wedge etalon 26.

FIG. 3B shows the wedge etalon passband PB at a position in between the channels at 1549.5 nm and 1550.0 nm, as occurs during channel switching. The relative gain associated with passbands PB2 at 1549.5 nm and 1550.0 are both high, with neither channel suppressed. The relative gain levels associated with passbands PB2 at 1549.0 nm and 1550.5 nm are suppressed relative to the 1549.5 nm and 1550.0 nm channels. The dashed line indicates the relative gain for passbands PB2 without suppression by wedge etalon 26.

FIG. 3C shows the wedge etalon passband PB3 centered with respect to the grid channel at 1550.0 nm, with the relative gain associated with the passband PB2 at 1550.0 nm being high, while the relative gain levels associated with adjacent passbands PB2 at 1549.5 nm and 1550.5 nm are suppressed relative to the selected 1550.0 nm channel, and the gain associated with passbands PB2 at 1551.0 nm and 1549.0 nm is further suppressed. Again, the dashed line indicates the relative gain for passbands PB2 without suppression by wedge etalon 26.

The passbands PB1 defined by the external cavity longitudinal modes are omitted from FIGS. 3A–3C for reason of clarity. As discussed previously, the laser will lase on the cavity mode with the highest round trip transmission through the cavity. In FIG. 3A, passband PB2 has the greatest transmission, and a laser mode close to the peak of PB2 will have the greatest overall transmission through the external cavity. By placing a small dither or frequency modulation on the optical path length of the cavity, an error signal may be generated which is usable to adjust the (mean) optical path length of the cavity so that the laser mode is locked to the peak of passband PB2 with the greatest transmission through passband PB3. It is also useful to place a small dither or frequency modulation on the location of passband PB3 to lock the peak of passband PB3 to the lasing mode, itself locked to a peak of passband PB2. The use of dither or modulation elements to introduce frequency modulation into laser components is described in U.S. patent application Ser. No. 09/900,426 entitled "Evaluation and Adjustment of Laser Losses According to Voltage Across Gain Medium" to inventors Daiber et al., noted above and incorporated herein by reference.

When passband PB3 is adjusted away from the location shown in FIG. 3A toward the position represented in FIG. 3B, the laser remains locked to the peak of passband PB2 with the greatest transmission. The adjustment of passband PB3 has minimal effect on the optical path length and is uncoupled from it. As noted above, previously used external cavity lasers have overcome "mode-hopping" by coupling a change in optical path length with the tuning of passband PB3, according to a predetermined relationship, to ensure that the wavelength of the lasing mode tracks the passband PB3. The uncoupled tuning configuration allows accurate locking of the optical path length and the lasing wavelength without requiring a similar accuracy in the locking of the tuning filter passband PB3. The laser wavelength remains constant with respect to motion of passband PB3 until the passband approaches another peak of passband PB2 as shown in FIG. 3C. In alternative embodiments of the present invention (not shown) where a grid generator PB2 is not present inside the laser cavity, tuning occurs similar to the tuning shown in FIGS. 3A–3C except that the grid passbands PB2 are replaced by the laser mode passbands PB1.

Figure 4:
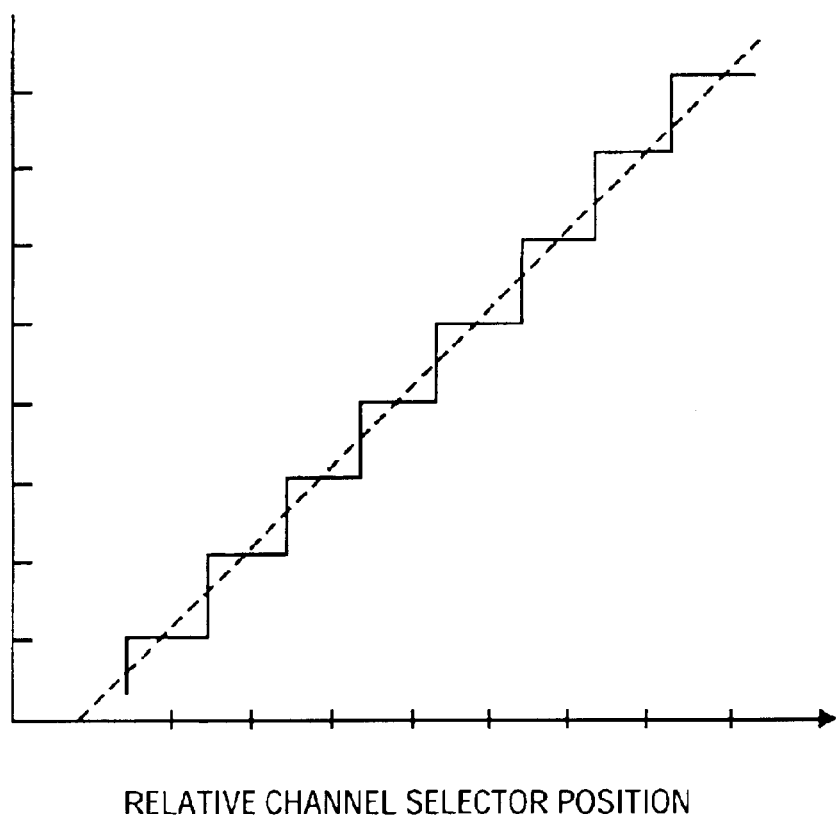
FIG. 4 is a graphical illustration of a wavelength tuning profile of the external cavity laser apparatus of the invention shown with the wavelength grid defined by the grid generator.

The present invention utilizes wavelength tuning that is independent from or otherwise decoupled from the tuning of the external cavity optical path length in accordance with the invention. As a result, the external cavity laser 10 provides a "stair-step" or mode hop tuning profile. FIG. 4 graphically shows a "stair-step" laser output profile as relative channel selector position on the horizontal axis versus wavelength of lasing on the vertical axis. Channel selector passband peak wavelengths are shown as increments along the vertical axis, and corresponding channel selector positions for the passband peaks are shown as increments along the horizontal axis. On each "plateau" defined by the mode hop tuning, the wavelength of lasing remains stable despite changes in the peak transmission wavelength of the channel selector. The preferred embodiment is to lock the peak transmission wavelength of the channel selector to the wavelength of lasing to maximize the output power, maximize the side mode suppression ratio, and minimize the possibility that the channel selector position will deviate far enough to create a mode hop to a new channel. The lasing on each plateau P occurs in a longitudinal mode of the laser distinct from the longitudinal modes of all other plateaus P.

Figure 5:
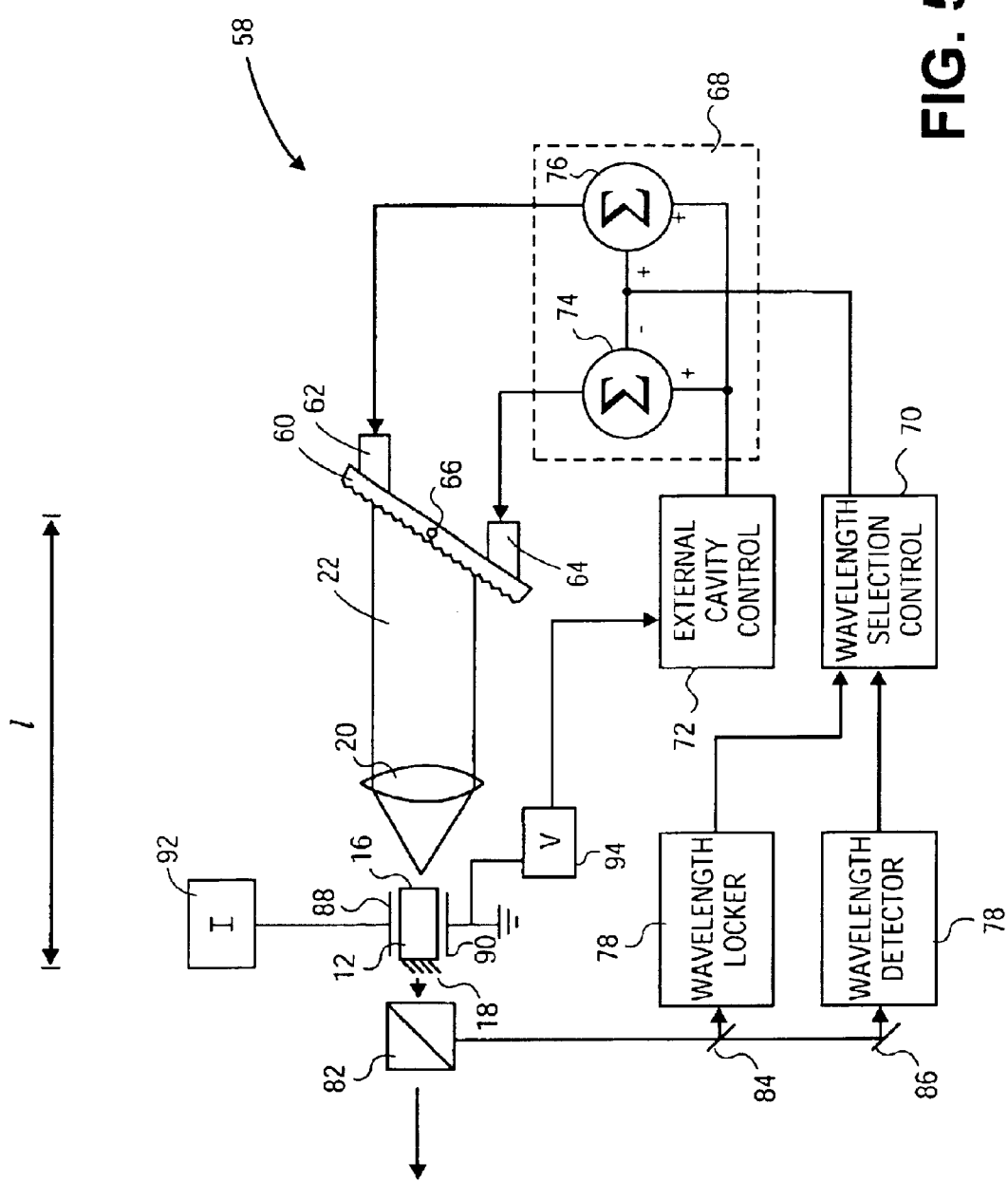
FIG. 5 is an external cavity laser apparatus with a grating channel selector using independent wavelength tuning and external cavity tuning.

Referring now to FIG. 5, there is shown another embodiment external cavity laser apparatus 58 in accordance with the invention, wherein like reference numbers are used to denote like parts. As in the embodiment of FIG. 1, the relative sizes of and distances between components is exaggerated for clarity. The external cavity laser apparatus 58 is shown with a grating 60 as a wavelength tuner, and arranged in a Littrow configuration. Grating 60 is operatively coupled to actuators 62, 64 which are symmetrically located on grating 60 with respect to a point 66 on the surface of grating 60 which lies generally in the center of optical path 22. Actuators 62, 64 may be piezoelectric, micromechanical, or other type of actuator. A tuner 68 commands changes in the length of actuators 62, 64.

The external cavity laser 58 includes a wavelength selection control element 70 and an external cavity control element 72, which are operatively coupled to tuner 68. Tuner 68 includes sum and difference signal generators 74, 76, which are operatively coupled to wavelength control element 70 and external cavity control element 72, to generate drive signals for actuators 62, 64. Wavelength control element 70 is operatively coupled to a wavelength locker 78 and a wavelength detector 80. A beam splitter 82 is positioned in front of output facet 18 to direct a portion of the laser output to wavelength locker 78 and wavelength detector 80 via reflective elements 84, 86 (reflector 84 is partially transmissive). Control signals for wavelength tuning are derived by wavelength control element 70 from the output of wavelength locker 78 and wavelength detector 80 and communicated to tuner 68, which drives actuators 62, 64 accordingly.

Gain medium 12 is coupled to electrodes 88, 90, with a drive current source 92 operatively coupled to electrode 88, and with electrode 90 suitably grounded. A voltage sensor 94 is operatively coupled to electrode 90 and to external cavity control element 72 (voltage sensor 94 may alternatively be coupled to electrode 88). Error signals derived from voltage monitored across gain medium 12 by sensor 94 are used by external cavity control element 72 to derive control signals for cavity optical path length tuning. These control signals are communicated to tuner 68 which drives actuators 62, 64 accordingly.

Equal changes in the length of actuators 62, 64 translate grating 60 along beam 22 to change the optical path length l (defined by grating 60 and gain medium facet 18) without tuning the grating 60 to affect wavelength. Changing the length of actuators 62, 64 with equal magnitudes but in opposite directions pivots grating 60 with respect to point 62 to change the tuning of grating 60 without changing the optical path length l of the external cavity. The tuning of the passband of grating 60 is this independent or uncoupled from tuning of the optical path length, and the tuning of the optical path length is likewise independent or uncoupled from the tuning of the passband of grating 60. This orthogonal tuning of the grating passband and cavity optical path length is achieved using the same actuators 62, 64 together, but in different ways to achieve the different tunings. A grid generator is not shown with the external cavity laser 58, but may be included therewith.

Figure 6:
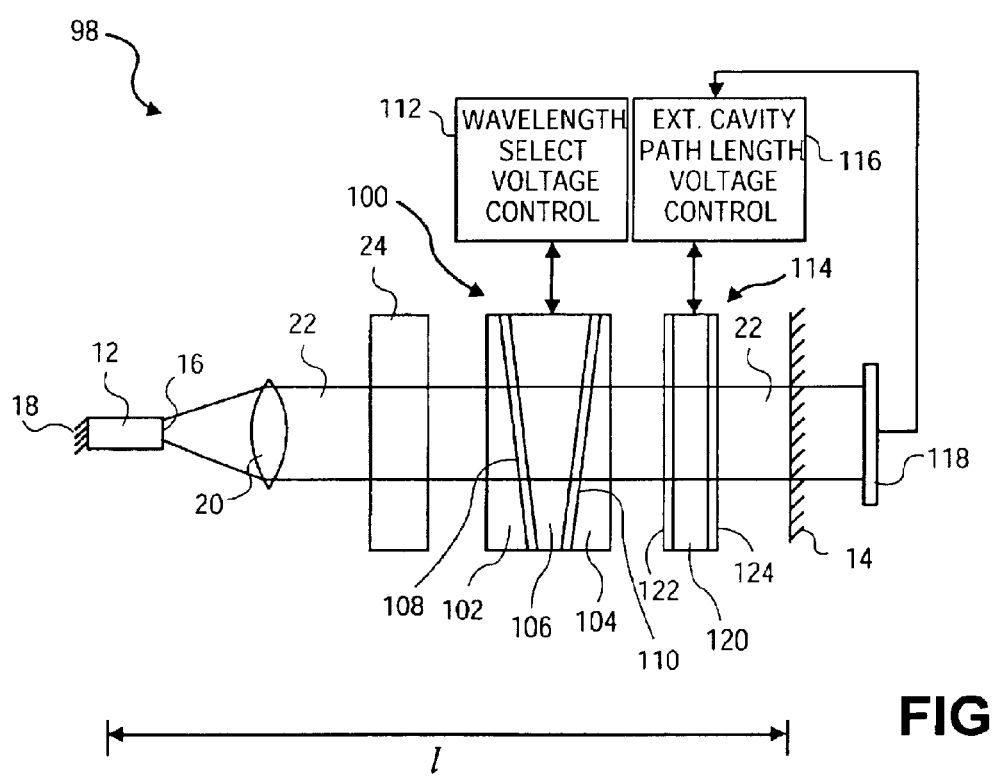
FIG. 6 is an external cavity laser apparatus with an electro-optic wavelength tuner and an electro-optic external cavity tuner.

Referring now to FIG. 6, there is shown another embodiment of an external cavity laser 98 in accordance with the invention, wherein like reference numbers are used to denote like parts. The external cavity laser uses a first electro-optic tunable element 100. Electro-optic tunable element 100 includes a pair of transparent substrates 102, 104 with electro-optic liquid crystal (LC) material 106 interposed between. Transparent electrodes 108, 110 are respectively positioned adjacent substrates 102, 104, and define reflective or partially reflective surfaces such that LC substrate acts as an etalon. Transparent electrodes 108, 110 may comprise, for example, an indium-tin oxide (ITO) conductor. Alignment layers (not shown), which may comprise oriented or grooved polymer layers, are positioned between LC material 86 and transparent electrodes 108, 110. The fabrication and use of liquid crystalline electro-optic devices of this sort is well known in the art.

First electro-optic tuning element 100 is operatively coupled to a wavelength controller 112 which provides an adjustable voltage to one of transparent electrodes 108, 110, the other of which is suitable grounded. LC material 106 comprises a plurality of individual, birefringent liquid crystalline molecules (not shown) that can undergo orientation in response to voltage applied across LC material 106 by electrodes 108, 110. Liquid crystalline materials of this sort are well known in the art and are not described herein. The change in orientation of the liquid crystalline molecules changes the refractive index of LC material 106, and hence the effective optical thickness of LC material 106. Thus, voltage applied across transparent electrodes 108, 110 by wavelength controller will vary the effective optical path length between partially reflective surfaces 108 and 110 experienced by a coherent beam as it passes through LC substrate 106 along optical path 22. The change in effective optical path length tunes the wavelength of maximum transmission of electro-optic tuning element 100. The use of an electro-optic channel selector is also disclosed in U.S. patent application Ser. No. 09/814,646 filed on Mar. 21, 2001, the disclosure of which is incorporated herein by reference.

External cavity laser apparatus 98 also includes a second electro-optically activated tuning element 114 positioned in optical path 22 before end mirror 14 and after first electro-optic tuning element 100. Electro-optic tuning element 114 is operatively coupled to an external cavity controller 116, which in turn is operatively coupled to a photodetector 118 positioned in optical path 22 after end mirror 14. In this regard, end mirror 14 may be, for example, 95% reflective such that end mirror allows a portion of output from the external cavity laser 98 to reach photodetector 118. Photodetector 118 may alternatively be replaced by a voltage sensor configured to monitor voltage across gain medium 12 in the manner described above.

Second electro-optic tuning element 114 includes a layer 120 of lithium niobate or other electro-optic material positioned between transparent electrodes 122, 124. External cavity controller 116 is configured to apply an adjustable voltage to one of electrodes 122, 124, the other of which is suitably grounded. Second electro-optic tuning element 114 is configured such that adjustment of voltage across the electro-optic material of tuning element 114, while changing the effective optical thickness of tuning element 114, also adjusts the overall optical path length l across the external cavity (between diode facet 18 and end mirror 14). The use of an electro-optic element for external cavity tuning is also described in U.S. patent application Ser. No. 09/900,426 entitled "Evaluation and Adjustment of Laser Losses According to Voltage Across Gain Medium" to inventors Daiber et al., noted above and incorporated herein by reference.

In the operation of external cavity laser 98, wavelength tuning or channel selection is carried out by adjusting the voltage applied across LC substrate 86 by electrodes 108, 110 according to instruction from wavelength controller 112, which may obtain voltage information for selected transmission channel wavelengths from stored look-up table data. Adjustment of external cavity optical path length l is achieved by adjusting the voltage applied across electro-optical material layer 120 by electrodes 122, 124 by external cavity controller 116 according to error signals derived from photodetector 118. As in the above embodiments, wavelength tuning by first electrooptic tuner 100 and wavelength controller 112 is carried out independently from the tuning of external cavity optical path length l by second electro-optic tuner 114 and external cavity controller 116. That is, the tuning of first electro-optic tuner 100 by wavelength controller 112 is uncoupled from the tuning of second electro-optic tuner 114 by external cavity controller. The external cavity laser 98 is notable in that it achieves independent wavelength tuning and external cavity tuning without physical actuation of any elements, i.e., without moving parts.

The second electro-optic tuning element 116 may also be used to introduce a signal modulation in the form of a frequency dither into the optical path length l of the external cavity laser. The signal modulation may comprise, for example, a frequency modulation of about 20 kHz. Modulation of the optical path length l via frequency dither introduced by element 116 produces intensity variations in the output power of external cavity laser 98 which are detectable by photodetector 118 (or by monitoring voltage across gain medium 12 due to optical feedback thereinto from the external cavity). These intensity variations will vary in magnitude and phase error according to alignment of an external cavity mode with the center wavelength of the passbands defined by electro-optic tuning element 100 and grid generator 24. In other words, the intensity variations and phase shift in the modulation signal provide an effective way to evaluate external cavity losses and develop corresponding error signals for the adjustment of external cavity optical path length. Thus, external cavity controller 116 derives error signals from the modulation introduced by the frequency either, and communicates compensation signals to external cavity controller 116, which correspondingly adjusts the voltage applied across electro-optic substrate 120 to tune or adjust the optical path length l by changing the refractive index of substrate 120. The use of modulation elements to introduce frequency modulation or dither into laser components is described in U.S. patent application Ser. No. 09/900,426 entitled "Evaluation and Adjustment of Laser Losses According to Voltage Across Gain Medium" to inventors Daiber et al., noted above and incorporated herein by reference.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A laser, comprising:
    a gain medium having first and second output facets, the gain medium emitting a coherent beam from the first output facet along an optical path;
    an end mirror located in the optical path, the end mirror and the second output facet defining an external cavity;
    a laser mode selector positioned in the optical path before the end mirror;
    a laser mode tuning assembly operatively coupled to the end mirror to adjust the position of the end mirror to adjust the optical path length of the external cavity to lock the laser onto a peak of a first passband, the first passband representing the laser mode;
    a laser channel selector positioned in the optical path; and
    a laser channel tuning assembly operatively coupled to the laser channel selector to adjust the position of the laser channel selector to lock the laser channel onto a peak of a second passband, the second passband representing the laser channel,
    the laser channel tuning assembly further coupled to adjust the position of the laser channel selector to unlock the laser channel from the peak of the second passband, while the laser mode tuning assembly is to maintain the laser mode locked onto the first passband.

2. The laser of claim 1, wherein:

(a) said channel selector tuner is operable according to a channel selection signal; and (b) said external cavity is operable according to a cavity mode signal.

3. The laser of claim 2, wherein said channel selection signal is derived independently from said cavity mode signal.

4. The external cavity laser apparatus of claim 2, wherein the channel selector is a grid generator.

5. The laser of claim 3, wherein:

(a) said channel selection signal is derived from channel selector tuning data in a look-up table; and (b) said cavity mode signal is derived from a detector configured to measure external cavity loss associated with cavity optical path length.

6. The laser of claim 1, wherein:

(a) said channel selector tuner is operatively coupled to a first controller and operable according to channel selector tuning data in a look-up table; and (b) said external cavity tuner is operatively coupled to a second controller and operable according to error signals derived from a detector configured to measure external cavity loss associated with cavity optical path length.

7. The external cavity laser apparatus of claim 6, wherein said detector comprises a voltage sensor configured measure voltage modulation across said gain medium.

8. The external cavity laser apparatus of claim 6, further comprising a modulation element, said modulation element operatively coupled to said external cavity and configured to introduce a modulation to said cavity optical path length, said modulation usable to derive a cavity error mode signal.

9. The external cavity laser apparatus of claim 1, wherein said laser mode tuning assembly comprises a thermally tunable compensating member, said thermally tunable compensating member coupled to said end mirror.

\* \* \* \* \*